(12) United States Patent
Ito

(10) Patent No.: US 6,607,396 B1
(45) Date of Patent: Aug. 19, 2003

(54) IC SOCKET

(75) Inventor: Sadao Ito, Tokyo (JP)

(73) Assignee: Shoei Electric Co., Ltd., Tokyo (JP)

( * ) Notice: Subject to any disclaimer, the term of this patent is extended or adjusted under 35 U.S.C. 154(b) by 0 days.

(21) Appl. No.: 09/720,732

(22) PCT Filed: Jul. 16, 1999

(86) PCT No.: PCT/JP99/03848
§ 371 (c)(1),
(2), (4) Date: Dec. 29, 2000

(87) PCT Pub. No.: WO00/04610
PCT Pub. Date: Jan. 27, 2000

(30) Foreign Application Priority Data

Jul. 16, 1998 (JP) .......................................... 10-201617

(51) Int. Cl.[7] .............................................. H01R 13/62
(52) U.S. Cl. .......................................... 439/331; 439/72
(58) Field of Search ............................. 439/69–73, 65, 439/66, 330, 331, 525, 526

(56) References Cited

U.S. PATENT DOCUMENTS

| | | | | |
|---|---|---|---|---|
| 4,144,648 A | * | 3/1979 | Grovender | 439/331 |
| 4,164,003 A | * | 8/1979 | Cutchaw | 439/331 |
| 4,437,718 A | * | 3/1984 | Selinko | 439/331 |
| 4,706,161 A | * | 11/1987 | Buckingham | 439/331 |
| 5,104,327 A | * | 4/1992 | Walburn | 439/71 |
| 5,452,183 A | * | 9/1995 | Renn | 439/331 |
| 5,975,915 A | * | 11/1999 | Yamazaki et al. | 439/72 |
| 5,997,316 A | * | 12/1999 | Kunzel | 439/331 |

* cited by examiner

*Primary Examiner*—Hien Vu
(74) *Attorney, Agent, or Firm*—Jones, Tullar & Cooper, P.C.

(57) ABSTRACT

A mount device which permits an IC to be detachably attached to a circuit board without difficulty. A conductor pattern having conductors arranged at the same interval as the terminal pins of the IC is formed on the circuit board, and a fixture frame is put on the circuit board to encircle the conductor pattern. The IC is put in the fixture frame, allowing the terminal pins lying on the conductors of the conductor pattern in one-to-one correspondence relation. An intermediate frame is put on the fixture frame, and then an uppermost frame is put on the intermediate frame, which is thus sandwiched between the uppermost frame and the fixture frame. The uppermost frame is fastened to the fixture frame with screws. The intermediate frame has pushing projections formed on its bottom surface, and these pushing projections are applied to the terminal pins. Thus, the uppermost frame when fastened to the fixture frame with screws, will push the terminal pins against the conductors of the conductor pattern 5 via the pushing projections. Projecting screws are inserted in the through holes of the uppermost frame until their ends abut on the intermediate lengths of the pushing projections, thereby preventing the upward bends of the pushing projections. The telescoping of the intermediate frame into the fixture frame effectively prevents the wavy deformation of the pushing projections. Thus, it is increasingly assured that the terminal pins be put in contact with the conductors of the conductor pattern.

2 Claims, 8 Drawing Sheets

A — A

B — B

A — A

FIG. 10
FIG. 11
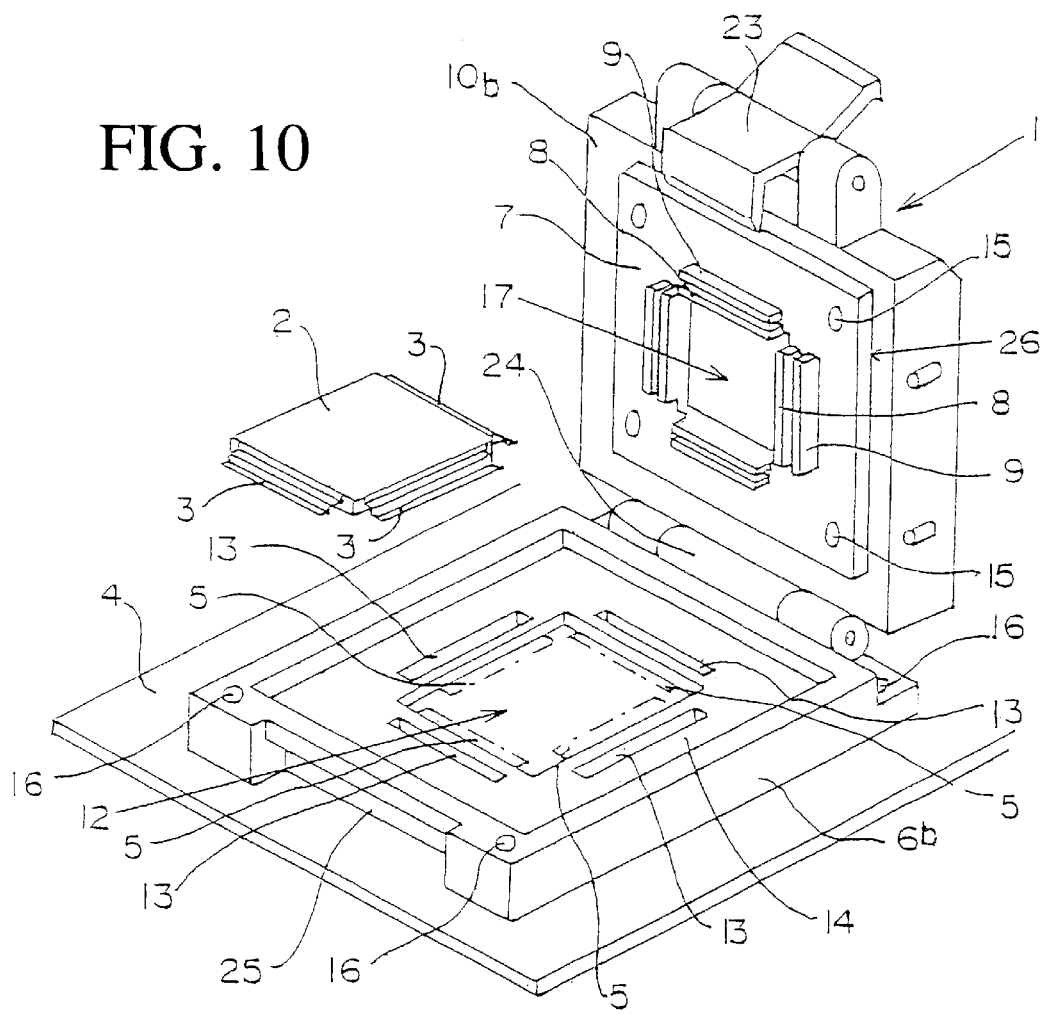
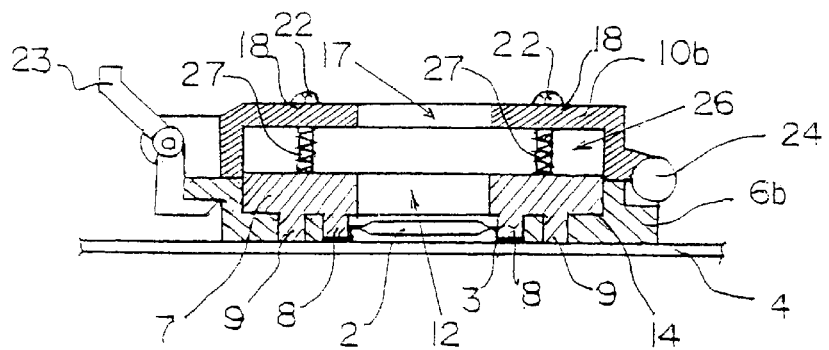

IC SOCKET

TECHNICAL FIELD

The present invention relates to a socket for use in attaching an IC to a circuit board detachably.

BACKGROUND ART

As electronic techniques have been developing rapidly, there has been an ever increasing demand for integrated circuits each having a reduced chip size in spite of its increasing degree of integration. Accordingly, the number of input/output terminals increases more and more, and the space between adjacent conductor patterns on a printed circuit board is reduced less and less.

In case that integrated circuits are produced for trial or in small lots it is required that each of the so produced integrated circuits be so attached to a circuit board as to be changed one after another. A selected integrated circuit is fixed to the circuit board by soldering its pins to selected conductors in the circuit board. When removing the integrated circuit from the circuit board for changing, it is necessary to remove the solder completely from the integrated circuit, but this work is difficult, and the difficulty will increase with the increase of the number of pins, and hence, with the reduction of pin-to-pin interval. Pins are often bent or deformed when removing integrated circuits from the circuit board. An integrated circuit cannot be changed on the circuit board without difficulty.

The present invention aims at the solving of the problems above described, and the object of the present invention is to provide an IC mount device which permits an IC to be detachably attached to a circuit board without difficulty, requiring no soldering.

DISCLOSURE OF THE INVENTION

An IC socket according to the present invention is constructed as follows:

A circuit board has a conductor pattern formed thereon, the conductor pattern having conductors arranged at the same interval as the terminal pins of an IC; a fixture frame has a rectangular window opening formed therein, and it is fixed to the circuit board with its window frame surrounding the conductor pattern; the IC is put in the window opening of the fixture frame, allowing its terminal pins to he on the conductors of the conductor pattern; a rectangular intermediate frame has a window opening and linear ridge-like retainers integrally formed round the window opening, the linear ridge-like retainers being spaced apart from each other at their opposite ends, and the intermediate frame is put on the fixture frame with the linear ridge-like retainers inserted in the window opening of the fixture frame, running along the inner side edges of the fixture frame and lying on the terminal pins of the IC; an uppermost frame is put on the intermediate frame to be fixed to the fixture frame by inserting fastening screws in the through holes made at the four corners of the uppermost frame whereas the intermediate lengths of the linear ridge-like retainers are pushed with pushing screws, which are inserted in the four sides of the uppermost frame until their ends appear on the bottom of the uppermost frame to push the linear ridge-like retainers, thereby pushing the terminal pins of the IC against the conductors of the conductor pattern.

The intermediate frame has linear slots made on its bottom, the linear slots running along the linear ridge-like retainers whereas the fixture frame has fitting projections formed on its upper surface, which fitting projections are allowed to be fitted in the linear slots of the intermediate frame when it is put on the fixture frame.

The inner spaces of the fixture frame, intermediate frame and uppermost frame are larger than the IC body to allow the terminal pins of the IC to be exposed at their base parts.

The intermediate frame has slots formed on its bottom, extending parallel to the ridge-like retainers, and the fixture frame has ridges formed on its top surface to be fitted in the slots of the intermediate frame when being put on the fixture frame.

The rectangular fixture frame has a guide slot made in each corner, thereby permitting the corners of the IC to be guided when being put in the fixture frame.

Each guide slot is inclined outward.

The inner spaces of the fixture frame, intermediate frame and uppermost frame are larger than the IC body to allow the terminal pins of the IC to be exposed at their base parts.

BRIEF DESCRIPTION OF THE DRAWINGS

FIG. 10 is a perspective view of an IC socket according to a third embodiment of the present invention; and FIG. 11 is a sectional view of the IC socket of FIG. 10.

BEST MODE OF REDUCING THE INVENTION TO PRACTICE

Figure 1:
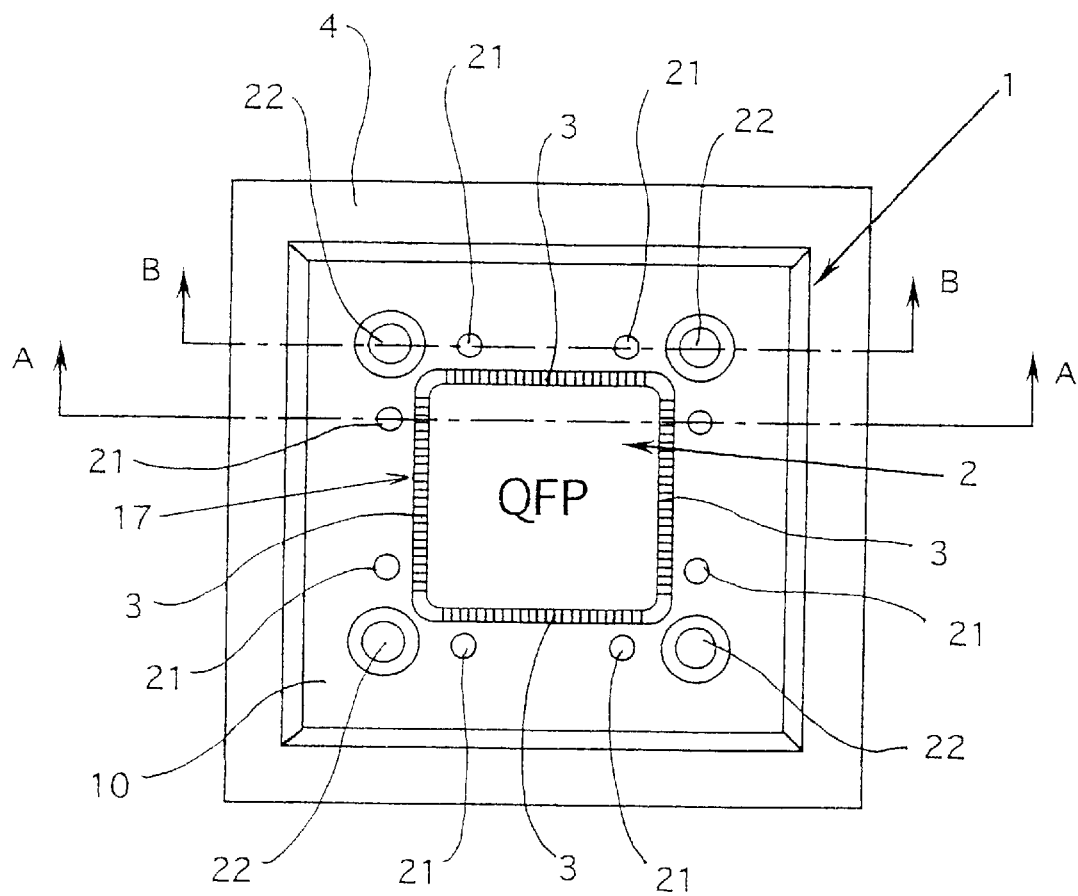
FIG. 1 is a plane view of an IC socket according to a first embodiment of the present invention, the socket being loaded with an IC.
Figure 2:
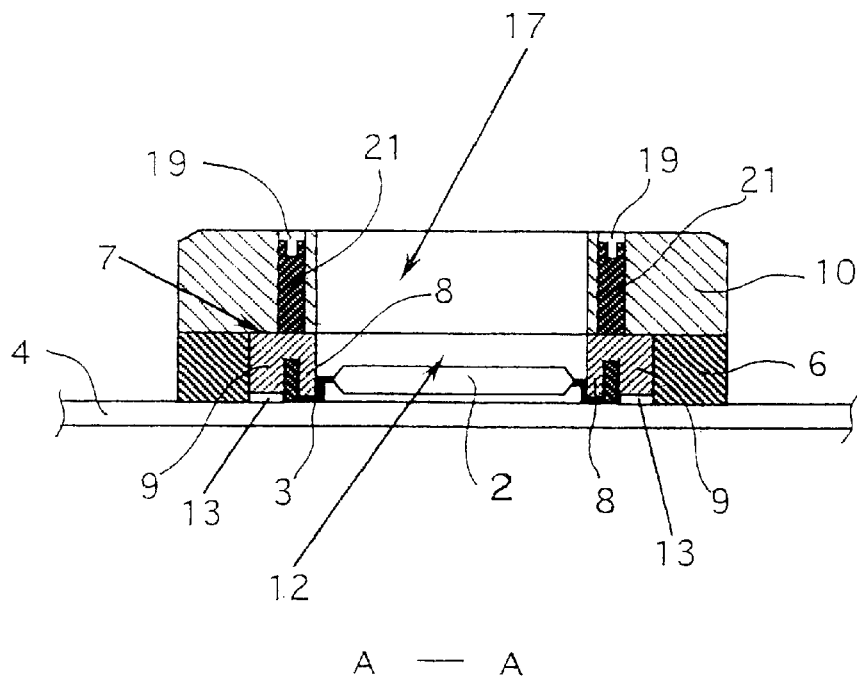
FIG. 2 is a sectional view of the IC socket taken along the line A—A in FIG. 1.
Figure 3:
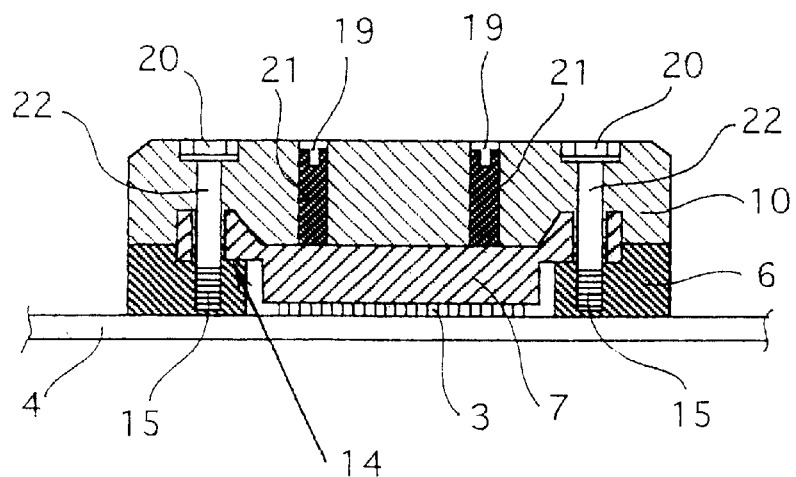
FIG. 3 is a sectional view of the IC socket taken along the line B—B in FIG. 1.
Figure 4:
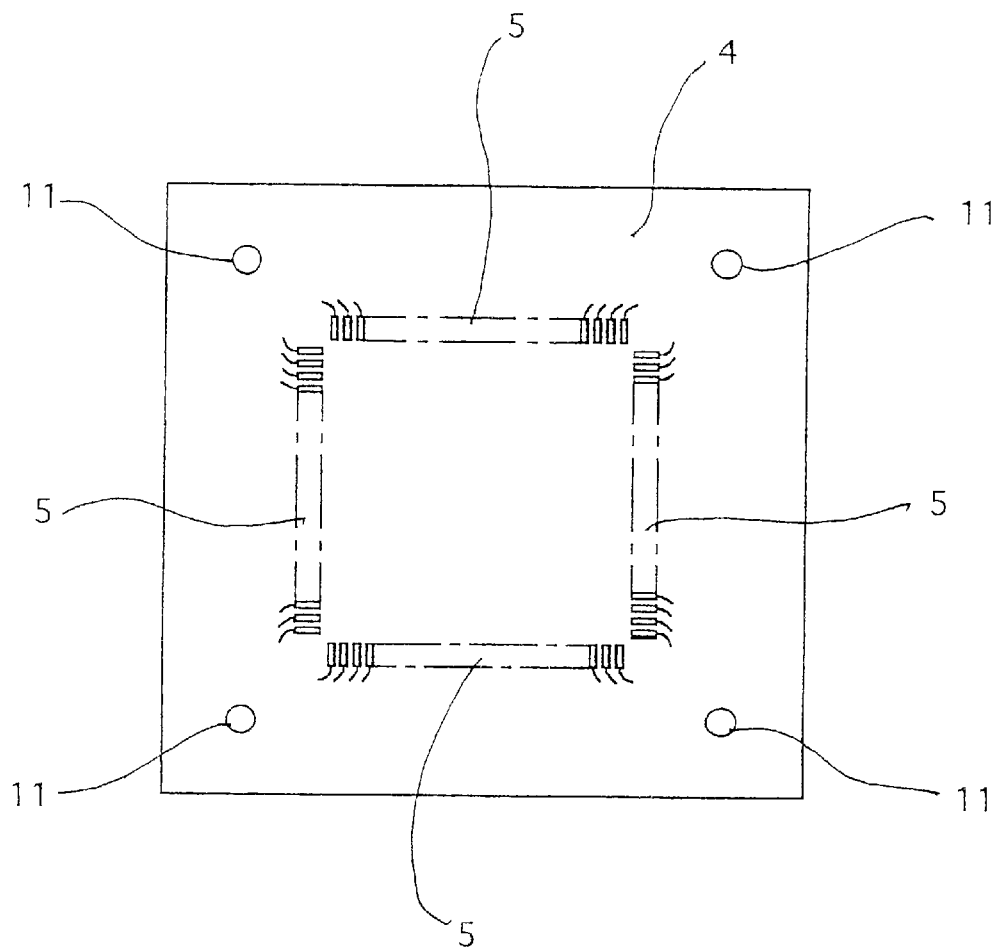
FIG. 4 is a plane view of a circuit board.
Figure 5:
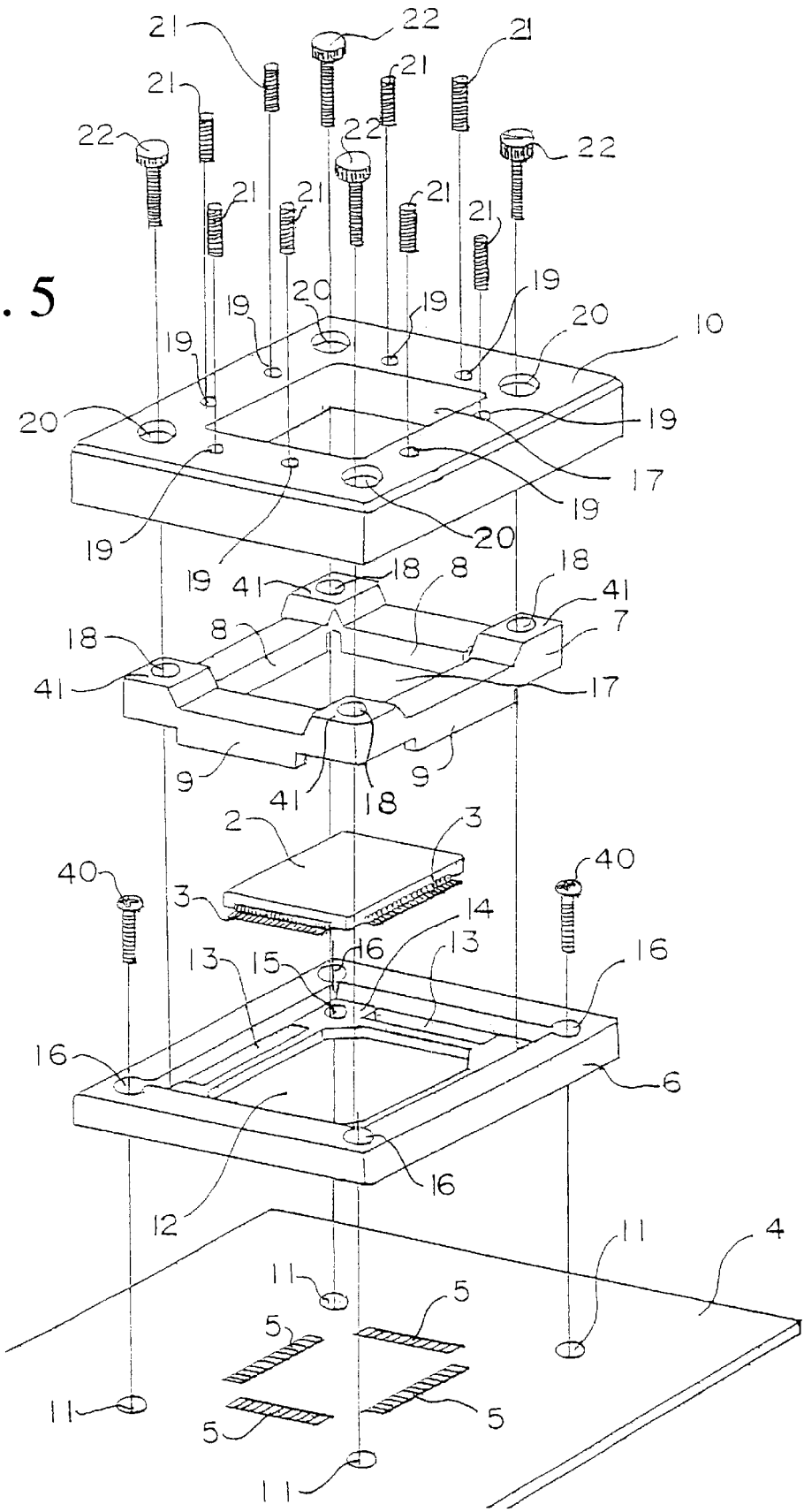
FIG. 5 is an exploded view of the IC socket.

Referring to the accompanying drawings IC sockets according to the present invention are described below:

FIG. 1 is a plane view of an IC socket having an IC fitted therein; FIG. 2

The IC socket is indicated generally by 1, and the IC is indicated by 2. The circuit board 4 has a conductor pattern 5 formed thereon, the conductors of the conductor pattern 5 being arranged to be in alignment with the pin terminals 3 of the IC 2 when the IC is put on the circuit board 4.

The fixture frame 6 is fixed to the circuit board 4, and the intermediate frame 7 and the uppermost frame 10 are laid on top of each other. The three frames, so arranged, are integrally connected by screws 22 to provide an IC socket. These frames are made of plastic material, such as polyether sulfonate. This particular plastic material may be preferably used because of its size stability.

The IC shown in the drawings is of the QFP type, comprising a square package having gull wing-like terminal pins 3 projecting horizontally from its four sides. The IC socket can accommodate a different type of IC, such as an IC of the SOP type having terminal pins projecting from two selected opposite sides of its package.

The circuit board 4 is of a laminated structure in which the conductor pattern 5 is connected to a desired electric circuit (not shown) via its wiring patterns, through-holes, and inner-layered patterns.

The fixture frame 6 is so placed that its four sides may encircle the conductor pattern 5, allowing the conductor pattern 5 to appear in its window opening 12. The window opening 12 has the same size as the IC 2 having its terminal pins 3 projecting from its four sides.

The fixture frame 6 has a step-like shelf 14 projecting from the inner edges of its four sides, and the step-like shelf 14 has slots 13 made thereon, each running parallel with each side of the square window 12. Tapped holes 15 are made at the corners of the step-like shelf 14 for fixing the uppermost frame 10 thereto, whereas through holes 16 are made at the corners of the fixture frame 6 for placing the overlying frames in alignment.

The intermediate frame 7 has a window opening 17 somewhat smaller than the window opening 12. The intermediate frame 7 has plateaus 41 formed at its corners, and each plateau 41 has through holes 18 for fastening the intermediate frame 7. The intermediate frame 7 has ridge-like retainers 8 formed inward on its four sides, and ridge-like projections 9 formed outside of the ridge-like retainers 8, thus defining slots therebetween.

The uppermost frame 10 has fastening holes 20 made at its corners and two tapped through holes 19 made in each side.

As described earlier, the fixture frame 6 is put on the circuit board 4 to be fastened to the circuit board 4 by inserting four fastening screws 40 (two screws shown).

An IC 2 is put in the window opening 12 of the fixture frame 6 with its terminal pins 3 laid on the conductors of the conductor pattern 5.

Then, the intermediate frame 7 is put on the fixture frame 6 with the four ridge-like projections 9 of the intermediate frame 7 fitted in the four slots 13 of the fixture frame 6, allowing the ridge-like retainers 8 of the intermediate frame 7 to traverse and lie on the terminal pins 3 of the IC 2.

Finally, the uppermost frame 10 is put on the intermediate frame 7, and then, the fastening screws 22 are inserted in the through holes 20 of the uppermost frame 10, the through holes 18 of the intermediate holes 7 and the tapped through holes 15 of the fixture frame 6, thus providing an integral lamination. The plateaus of the corners of the intermediate frame 7 are fitted in the counter recesses (not shown) which are formed on the bottom of the uppermost frame 10, thereby preventing any deviation of the uppermost frame 10 relative to the intermediate frame 7.

The projecting-and-pushing screws 21 are inserted in the tapped holes 19 so that their ends reach and push the ridge-like retainers 8 of the intermediate frame 7, thus putting the terminal pins 3 of the IC 2 evenly in contact with the conductors of the conductor pattern 5.

Thanks to the ridge-like retainers 8 of the intermediate frame 7 and the projecting-and-pushing screws 21 passing through the uppermost frame 10 the elongated arrangement of parallel terminal pins 3 can be pushed evenly against the conductors of the conductor pattern 5, thereby assuring that the IC is connected to the circuit board 4. The projecting-and-pushing screws 21 effectively presents the intermediate section of the ridge-like retainers 8 from rising upward. The ridge-like projections 9 of the intermediate frame 7, which are fitted in the slots 13 of the fixture frame 6, effectively prevents the ridge-like retainers 8 from being bent, thus keeping them straight. No matter how many terminal pins may be arranged in line, it is assured that all the terminal pins are put in contact with the conductors of the conductor pattern 5.

When the uppermost frame 10 and the intermediate frame 7 are removed from the underlying fixture frame 6, the IC 2 can be readily removed from the fixture frame 6, thus facilitating the changing of ICs in testing.

Referring to FIG. 1 again, the window openings 17 of the uppermost and intermediate frames 10 and 7 are somewhat larger than the package of the IC 2, thereby permitting a test probe to have access to the base part of a selected terminal pin 3 above the uppermost frame 10, thus permitting the IC to be tested as to its characteristics without taking out the IC from the circuit board 4.

Figure 6:
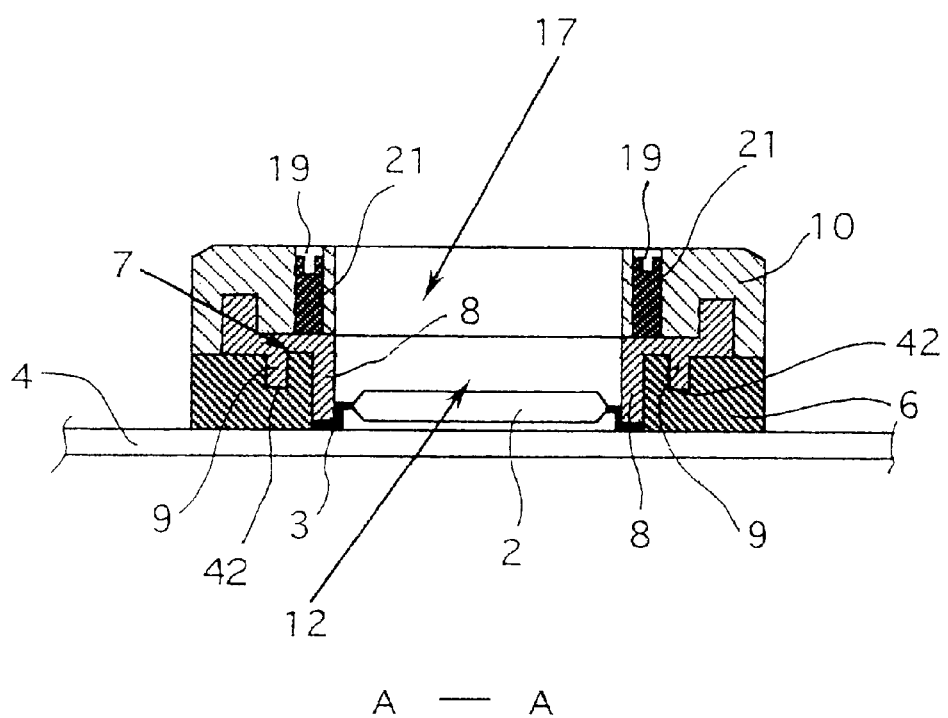
FIG. 6 is a sectional view of an IC socket according to a second embodiment of the present invention taken along the line A—A.
Figure 7:
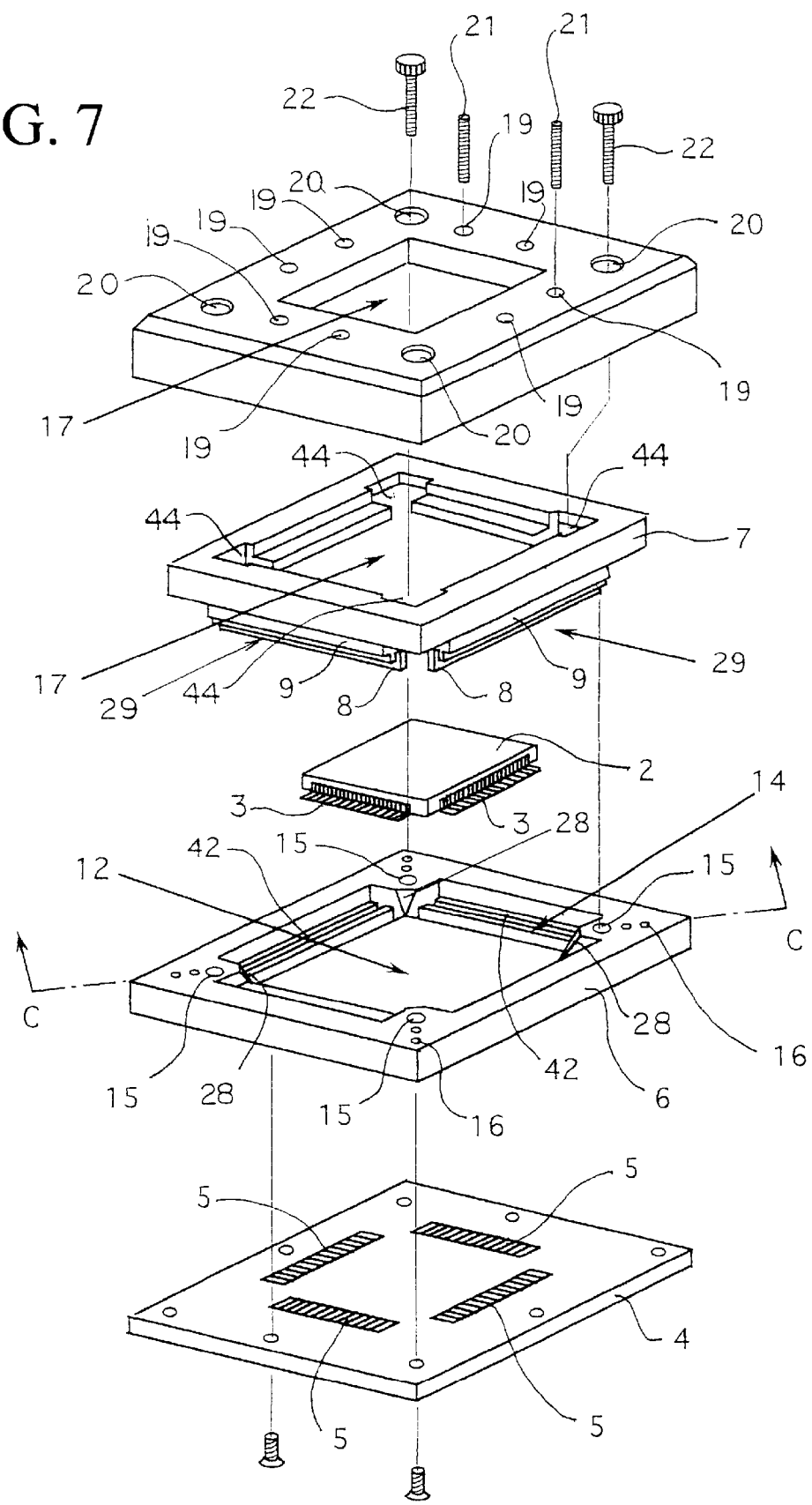
FIG. 7 is an exploded view of the IC socket according to the second embodiment.
Figure 8:
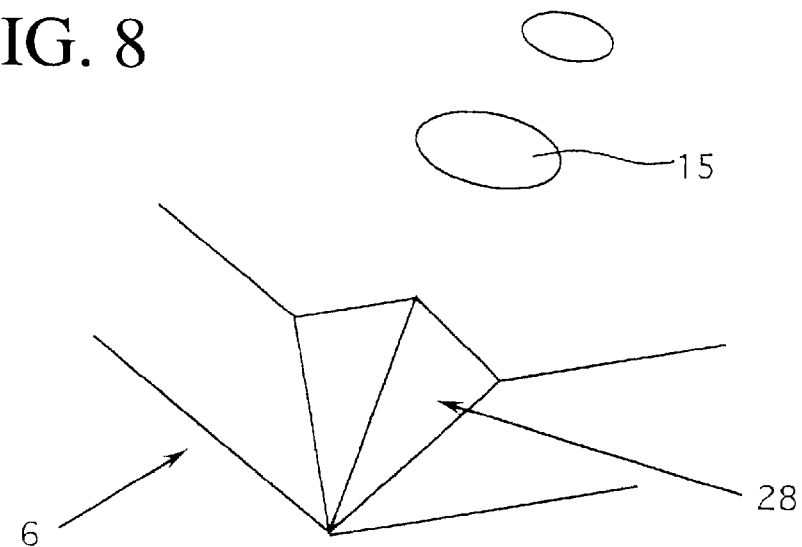
FIG. 8 is an enlarged perspective view of one of the corners of the window opening of the fixture frame.
Figure 9:
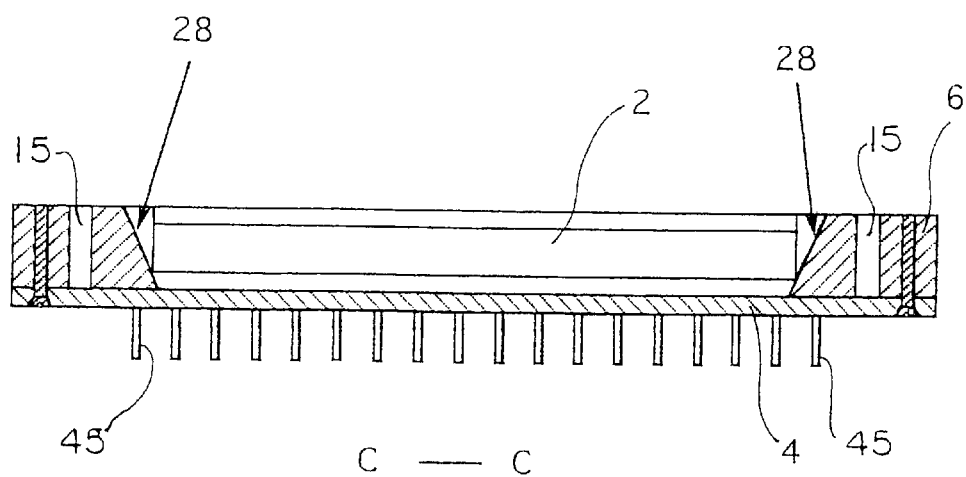
FIG. 9 is a sectional view of the fixture frame taken along the line C—C in FIG. 7.

FIG. 6 is a sectional view of an IC socket according to a second embodiment taken along the line A—A in FIG. 1 (FIG. 1 can be used as a plane view of the IC socket according to the second embodiment); FIG. 7 is an exploded view of the IC socket; FIG. 8 is an enlarged perspective view of one of the corners of the window opening of the fixture frame; and FIG. 9 is a sectional view of the fixture frame taken along the line C—C in FIG. 7.

In this particular embodiment the fixture frame 6 has a male-fitting slot 42 in place of the slot 13 in each side in the first embodiment, and the fixture frame 6 has a triangular guide slot 28 made at each corner of the window opening 12, as best seen from FIG. 8 on an enlarged scale.

The intermediate frame 7 has ridge-like projections 29 formed on its bottom to be fitted in the step-like shelves 14 of the fixture frame 6. The male-fitting projections 9 and ridge-like projections 8 are formed on the bottom of the intermediate frame 7. The intermediate frame 7 has notches 44 formed at its corners, thereby permitting the inward-corner extensions of the fixture frame 6 to be inserted in the notched corners of the intermediate frame 7. The ridge-like projections 8 reach short of the corners of the intermediate frame 7 as seen from FIG. 7.

The uppermost frame 10 is the same as in the first embodiment.

The circuit board 4 is a pitch-conversion board for use in expanding the relatively narrow pin-to-pin interval of the IC on the upper surface of the board to the relatively wide pinto-pin interval 45 on the lower surface of the board. Via the pitch-conversion board the IC can be mounted to a general-purpose board having pin-insertion apertures made in a lattice pattern.

When the IC 2 is put in the window opening 12 of the fixture frame 6, the four corners of the IC package descend along the inclined guide slots 28 of the fixture frame 6 (see FIG. 9) to be put in position. Thus, the terminal pins 3 of the IC 2 can be put exactly in alignment with the conductors of the conductor pattern 5 without fail.

Then, the intermediate frame 7 is put on the fixture frame 6 with the male-fitting projections 9 of the intermediate frame 7 fitted in the slots 42 of the fixture frame 6, and the uppermost frame 10 is put on the intermediate frame 7 to sandwich the intermediate frame 7 between the fixture frame 6 and the uppermost frame 10. The uppermost frame 10 is fixed to the fixture frame 6 by inserting the fastening screws 22 into the tapped through holes 15 of the fixture frame 6, thereby allowing the ridge-like push projections 8 to push the terminal pins 3 against the conductors of the conductor pattern 5.

The ridge-like push retainers 8 are not contiguous to each other, leaving spaces therebetween so that they may be guaranteed to be free from any distortion which otherwise would be caused by the interference from other ridge-like push retainers. Thus, every ridge-like push retainer is assured to be straight all the time, permitting application of an even pressure to the linear arrangement of terminal pins 3.

FIG. 10 is a perspective view of an IC socket according to a third embodiment of the present invention; and FIG. 11 is a sectional view of the IC socket of FIG. 10. It uses an IC mounting means as being improved over the first embodiment.

The fixture frame 6b has a window opening 12 made at its center. The window opening 12 is large enough to encircle the conductor pattern 5 of the circuit board 4, and the window frame is laid at a level lower than the top surface of the fixture frame 6b, and the window frame has slots 13 made on each side. The fixture frame 6b has positioning apertures 16 made at its corners.

The uppermost frame 10b is hinged to one side of the fixture frame 6b, as indicated at 24.

The uppermost frame 10b has a fastening nail 23 on the opening side, which is opposite to the hinged side, and the fixture frame 6 has a catch 25 formed on its unhinged side, thus permitting the uppermost frame 10b to be fastened to the fixture frame 6b with latch.

The uppermost frame 10b has a framed opening 17 made at its center, and the framed opening 17 is smaller than the window opening 12 of the fixture frame 6b. As shown, the uppermost frame 10b has a recess 26 made round the framed opening 17.

The intermediate frame 7 has a window opening 12 made in its bottom center area. The window opening 12 is somewhat larger than the IC 2 package. The intermediate frame 7 has pushing projections 8 and fitting projections 9 formed round its window opening 12, and the intermediate frame 7 has uppermost frame-fastening tapped holes 15 made therein, which tapped holes 15 are in alignment with the intermediate frame-fastening holes 18 of the uppermost frame 10b.

The intermediate frame 7 is fitted in the recess 26 of the uppermost frame 10 with the pushing projections 8 and fitting projections 9 directed downwards, and the intermediate frame 7 is suspended from the ceiling of the uppermost frame by the fastening screws 22, each of which has a coiled spring 27 wound therearound. Thus, the intermediate frame 7 can be moved up and down.

The fixture frame 6 is put on the circuit board 4 to encircle the conductor pattern 5 of the circuit board 4, and the fixture frame 6 is fixed to the circuit board 4 by inserting screws in the positioning holes 16. Then, an IC 2 is inserted in the window opening 12 with its terminal pins 3 directed downward, and the uppermost frame 10b turns around the hinge 24 to be put on the fixture frame 6b, allowing the fitting projections 9 of the movable intermediate frame 7 to enter the slots 13 of the fixture frame 6b, and at the same time, allowing the pushing projections 8 of the intermediate frame 6b to push the terminal pins 3 of the IC 2 against the conductors of the conductor pattern 5. The uppermost frame 10b is fastened to the fixture frame 6b with latch by allowing the nail 25 to be caught by the catch 25.

The terminal pins 3 of the IC 2 are pushed against the conductors of the conductor pattern 5 under a fixed pressure, which is caused as a counter force to the compressing of the coiled springs 27.

An IC 2 can be detachably mounted on the circuit board 4 simply by inserting the IC 2 in the window opening 12 of the fixture frame 6b and by closing the hinged uppermost frame 10b to be fastened to the fixture frame 6b with the latch, thus permitting the checking of the IC 2 within a minimum time.

As may be understood from the three embodiments described above, it is assured that the pin terminals 3 of the IC 2 be pushed against the conductors of the conductor pattern 5 in the circuit board 4, saving the trouble of soldering the IC 2 to the circuit board as was required before, still assuring that the reliable connection be established quickly between the IC and the circuit board.

INDUSTRIAL UTILITY OF THE INVENTION

In using an IC socket according to the present invention the fixture frame is fixed to a circuit board, and an IC is put in the fixture frame by allowing the corners of the IC to slide along the corner guide slots of the fixture frame, thus permitting the self-alignment of the IC relative to the fixture frame. The terminal pins of the IC can be pushed against the conductors of the conductor pattern in the circuit board by sandwiching the intermediate frame between the fixture frame and the uppermost frame with the ridge-like retainers of the intermediate frame pushed against the pin terminals of the IC. No soldering is required in fixing the IC to the circuit board.

Thanks to the intermediate lengths of the linear ridge-like retainers being formed inside of the intermediate frame and being pushed down with the pushing screws, the upper bending of the intermediate lengths which otherwise, would be caused by tightening the fastening screws, can be prevented. As a result the linear ridge-like retainers are pushed evenly against the terminal pins.

The linear ridge-like retainers are spaced apart from each other at their opposite ends. The linear ridge-like retainers are integrally formed round the window opening of the rectangular intermediate frame. When the intermediate frame is put on the fixture frame with the linear ridge-like retainers inserted in the window opening of the fixture frame, running along the inner side edges of the fixture frame, the linear ridge-like retainers lie exactly on the terminal pins of the IC. Then, the uppermost frame is put on the intermediate frame to be fixed to the fixture frame by inserting fastening screws in the through holes made at the four corners of the uppermost frame, and the intermediate lengths of the linear ridge-like retainers are pushed with pushing screws, which are inserted in the four sides of the uppermost frame until their ends appear on the bottom of the uppermost frame to push the linear ridge-like retainers, thereby pushing the terminal pins of the IC against the conductors of the conductor pattern.

Thanks to the intermediate lengths of the linear ridge-like retainers being formed inside of the intermediate frame and being pushed down with the pushing screws, the upper bending of the intermediate lengths which otherwise, would be caused by tightening the fastening screws, can be prevented. As a result the linear ridge-like retainers are pushed evenly against the terminal pins.

The linear ridge-like retainers are spaced apart from each other at their opposite ends, thus they are independent from each other to be guaranteed free of interference due to their inner stresses, so that their linearity may be assured. Thus, the tightening of the fastening and projecting screws will cause no deformation on the linear ridge-like retainers. Therefore, the linear ridge-like retainers are assured to lie on the terminal pins in position, so that all the terminal pins may be pushed against the conductors of the conductor pattern with precision.

There is no fear of incomplete contact between each terminal pin and the counter conductor; the intermediate lengths of the linear ridge-like retainers are prevented from bending upward, and the linear ridge-like retainers are prevented from being deformed.

As the linear ridge-like retainers are separated to be independent from each other, their pressing forces can be controlled individually by controlling the tightening of associated projecting screws.

The linear slots are made on the bottom of the intermediate frame, running along the linear ridge-like retainers whereas the linear fitting projections are formed on the upper surface of the fixture frame, which linear fitting projections are allowed to be fitted in the linear slots of the intermediate frame when it is put on the fixture frame. This arrangement assures that the linear ridge-like retainers are free from any deformation or bending even if the fastening screws are tightened. Thus, the linear ridge-like retainers cannot be bent inward or outward, retaining their linearity well, and therefore, there is no fear of causing incomplete contact between each terminal pin and the counter conductor.

The inner spaces of the fixture frame, intermediate frame and uppermost frame as defined in claim 1 are larger than the IC body to allow the terminal pins of the IC to be exposed at their base parts. Thus, a test probe can be put on a selected terminal pin, thereby advantageously permitting the determining of the characteristics of the IC without removing it from the circuit board. This is an outstanding advantage from the practical point of view.

What is claimed is:

1. An IC socket to be fixed to a circuit board having a conductor pattern formed thereon, the conductor pattern having conductors arranged an interval which is the same as the interval of the terminal pins of an IC, the IC socket comprising:

a plurality of fastening screws;

a plurality of pushing screws;

a fixture frame having a window opening formed therein and defining inner side edges, said fixture frame fixed to the circuit board with said window opening surrounding the conductor pattern, the IC mounted in the window opening of the fixture frame, so as to allow the terminal pins of the IC to lie on the conductors of the conductor pattern;

a rectangular intermediate frame having a window opening and linear ridge-like retainers extending outwardly and each having opposite ends and being spaced-apart from each other and integrally formed to define said window opening, said intermediate frame being adapted to be put on said fixture frame with the ridge-like retainers inserted in said window opening of said fixture frame, running along said inner side edges of said fixture frame, and lying on the terminal pins of the IC; and an uppermost frame including a bottom, four corners, four side portions connecting said four corners, a through hole at each of said four corners, and at least one additional through hole at each side portion, said uppermost frame being put on said rectangular intermediate frame and being fixed to said fixture frame by said fastening screws inserted in said through holes, wherein at intermediate lengths of said linear ridge-like retainers, said pushing screws are inserted in said additional through holes until their ends appear at said bottom of said uppermost frame and engage a respective linear ridge-like retainer to push said respective linear ridge-like retainers, thereby pushing the terminal pins of the IC against the conductors of the conductor pattern, wherein said rectangular intermediate frame further has linear ridge-like projections extending downwardly and parallel to said ridge-like retainers, and wherein said fixture frame further has slots for receiving a respective ridge-like projection of said rectangular intermediate frame when putting on said fixture frame.

2. An IC socket according to claim 1, wherein said fixture frame, said intermediate frame and said uppermost frame each define an inner space, and wherein said inner space of said fixture frame, of said intermediate frame and of said uppermost frame are larger than the IC body to allow the terminal pins of the IC to be exposed.

* * * * *